(12) United States Patent
Chen (10) Patent No.: US 11,817,477 B2
(45) Date of Patent: Nov. 14, 2023

(54) POWER SEMICONDUCTOR DEVICE

(71) Applicant: HON HAI PRECISION INDUSTRY CO., LTD., New Taipei (TW)

(72) Inventor: Chung-Yi Chen, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/659,334

(22) Filed: Apr. 15, 2022

(65) Prior Publication Data

US 2023/0253448 A1    Aug. 10, 2023

(30) Foreign Application Priority Data

Feb. 9, 2022 (TW) .................................. 111104777

(51) Int. Cl.
     *H01L 29/06*      (2006.01)
(52) U.S. Cl.
     CPC ...... *H01L 29/0615* (2013.01); *H01L 29/0688* (2013.01)
(58) Field of Classification Search
     CPC ............. H01L 29/0615; H01L 29/0688; H01L 29/0619; H01L 29/0623
     See application file for complete search history.

(56) References Cited

U.S. PATENT DOCUMENTS

| | | | |
|---|---|---|---|
| 6,833,583 B2 | 12/2004 | Zandt et al. | |
| 7,750,398 B2 | 7/2010 | Hshieh | |
| 8,319,290 B2 | 11/2012 | Grebs | |
| 8,643,092 B2 | 2/2014 | Hsieh | |
| 9,865,718 B1 | 1/2018 | Xiong et al. | |
| 9,911,803 B2 | 3/2018 | Saito et al. | |
| 2014/0231969 A1 | 8/2014 | Mauder et al. | |
| 2018/0076290 A1* | 3/2018 | Takayanagi | ....... H01L 29/66712 |
| 2020/0295129 A1* | 9/2020 | Kinoshita | ........... H01L 29/7813 |

FOREIGN PATENT DOCUMENTS

| | | |
|---|---|---|
| CN | 104885226 A | 9/2015 |
| TW | 201709507 A | 3/2017 |
| TW | 201839981 A | 11/2018 |
| TW | 201909415 A | 3/2019 |

OTHER PUBLICATIONS

Jee-Hun Jeong et al., "Study of a SiC Trench MOSFET Edge-Termination Structure with a Bottom Protection Well for a High Breakdown Voltage", Department of Electrical Engineering, Pusan National University, Pusan 46241, Korea, published on Jan. 21, 2020, pp. 1-7.

* cited by examiner

*Primary Examiner* — Syed I Gheyas
(74) *Attorney, Agent, or Firm* — CKC & Partners Co., LLC (57) ABSTRACT

A power semiconductor device includes a first electrode, a substrate, a first epitaxy layer, a second epitaxy layer, a gate electrode, and a second electrode. The substrate is located on the first electrode, and the substrate includes an active region and a termination region surrounding the active region. The first epitaxy layer is located on the substrate, and the first epitaxy layer has a first conductive type. The first epitaxy layer includes a first doped area and a second doped area. The first doped area has the first conductive type and is located in the termination region and the active region. The second doped area has a second conductive type and is located in the termination region. The second epitaxy layer is located on the first epitaxy layer. The gate electrode and the second electrode are located on the second epitaxy layer and are in the active region.

20 Claims, 6 Drawing Sheets

POWER SEMICONDUCTOR DEVICE

CROSS-REFERENCE TO RELATED APPLICATION

This application claims priority to Taiwan Application Serial Number 111104777, filed Feb. 9, 2022, which is herein incorporated by reference in its entirety.

BACKGROUND

Field of Invention

The present invention relates to a power semiconductor device.

Description of Related Art

Performance of a power semiconductor device is determined by the breakdown voltage and the drain to source resistance in on-state (RDSon). Doping concentration and thickness of the epitaxy layer and design of the termination region may influence the breakdown voltage. However, methods used to raise breakdown voltage usually reduce the RDSon at the same time. As a result, it is difficult to balance the breakdown voltage and the RDSon.

One of the common termination region designs is floating field ring. However, such method requires greater termination region area, which is against minimization. Other termination region designs include filling poly-silicon or oxide in trenches so as to reduce the electric filed crowding. However, such method may reduce reliability due to concentrated electrical stress at the edge of the termination region.

Accordingly, it is still a development direction for the industry to provide a power semiconductor device which can improve those problems mentioned above.

SUMMARY

One aspect of the present disclosure is a power semiconductor device.

In some embodiments, the power semiconductor device includes a first electrode, a substrate, at least one first epitaxy layer, a second epitaxy layer, a gate electrode, and a second electrode. The substrate is located on the first electrode and includes an active region and a termination region surrounding the active region. The first epitaxy layer is located on the substrate, and the first epitaxy layer has a first conductive type. The first epitaxy layer includes a first doped area and multiple second doped areas. The first doped area has the first conductive type and is located in the termination region and the active region. The second doped areas have a second conductive type and are located in the termination region. The second epitaxy layer is located on the first epitaxy layer. The gate electrode is located on the second epitaxy layer and located in the active region. The second electrode is located on the second epitaxy layer and located in the active region.

In some embodiments, a doping concentration of the first doped area is in a range from $5\times10^{17}$ cm$^{-3}$ to $1\times10^{19}$ cm$^{-3}$.

In some embodiments, a doping concentration of each of the second doped areas is in a range from $5\times10^{16}$ cm$^{-3}$ to $2\times10^{18}$ cm$^{-3}$.

In some embodiments, the first doped area further includes a first region and a second region, the first region is located between the second region and the second doped areas, and a doping concentration of the first region is greater than a doping concentration of the second region.

In some embodiments, a number of the first epitaxy layer is plural, and widths of the first doped areas of the first epitaxy layers increase as the distances between the first epitaxy layers and the second epitaxy layer increase.

In some embodiments, a number of the first epitaxy layer is plural, and widths of the first doped areas of the first epitaxy layers reduce as the distances between the first epitaxy layers and the second epitaxy layer increase.

In some embodiments, a number of the first epitaxy layer is plural, and thicknesses of the first epitaxy layers are different from each other.

In some embodiments, a width of one of the second doped areas is different from a width of another one of the second doped areas.

In some embodiments, a depth of one of the second doped areas is different from a depth of another one of the second doped areas.

In some embodiments, adjacent two of the second doped areas have a distance therebetween, and one of the distances between the second doped areas is different form another one of the distances between the second doped areas.

Another aspect of the present disclosure is a power semiconductor device.

In some embodiments, the power semiconductor device includes a first electrode, a substrate, multiple first epitaxy layers, a second epitaxy layer, a gate electrode, and a second electrode. The substrate is located on the first electrode and includes an active region and a termination region surrounding the active region. The first epitaxy layers are located on the substrate, and the first epitaxy layers have a first conductive type. Each of the first epitaxy layers includes a first doped area and a second doped area. The first doped area has the first conductive type and is located in the termination region and the active region. The second doped area has a second conductive type and is located in the termination region. The second epitaxy layer is located on the first epitaxy layers. The gate electrode is located on the second epitaxy layer and located in the active region. The second electrode is located on the second epitaxy layer and located in the active region.

In some embodiments, a doping concentration of the first doped area is in a range from $5\times10^{17}$ cm$^{-3}$ to $1\times10^{19}$ cm$^{-3}$.

In some embodiments, a doping concentration of the second doped area is in a range from $5\times10^{16}$ cm$^{-3}$ to $2\times10^{18}$ cm$^{-3}$.

In some embodiments, the first doped area further includes a first region and a second region, the first region is located between the second region and the second doped areas, and a doping concentration of the first region is greater than a doping concentration of the second region.

In some embodiments, thicknesses of the first epitaxy layers are different from each other.

In some embodiments, a width of the second doped area in one of the first epitaxy layers is different from a width of the second doped area in another one of first epitaxy layers.

In some embodiments, a depth of the second doped area in one of the first epitaxy layers is different from a depth of the second doped area in another one of first epitaxy layers.

In some embodiments, a doping concentration of the first doped area in one of the first epitaxy layers is different from a doping concentration of the first doped area in another one of the first epitaxy layers.

In some embodiments, a doping concentration of the second doped area in one of the first epitaxy layers is different from a doping concentration of the second doped area in another one of the first epitaxy layers.

In some embodiments, a number of the second doped area in each one of the first epitaxy layers is plural, and doping concentrations of the second doped areas in the same first epitaxy layer are different from each other.

In the aforementioned embodiments, the electric field in the first epitaxy layer, the second epitaxy layer, and the edge of the termination region can be reduced by disposing the second doped areas in the termination region, and therefore the reliability can be improved. The drain to source resistance in on-state of the first doped area of the present disclosure is reduced by disposing the first doped area in the active region and the termination region, and therefore the drain to source resistance in on-state of the overall power semiconductor device is reduced. With such configuration, the area and the overall volume of the termination region of the power semiconductor device can be reduced.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1A:
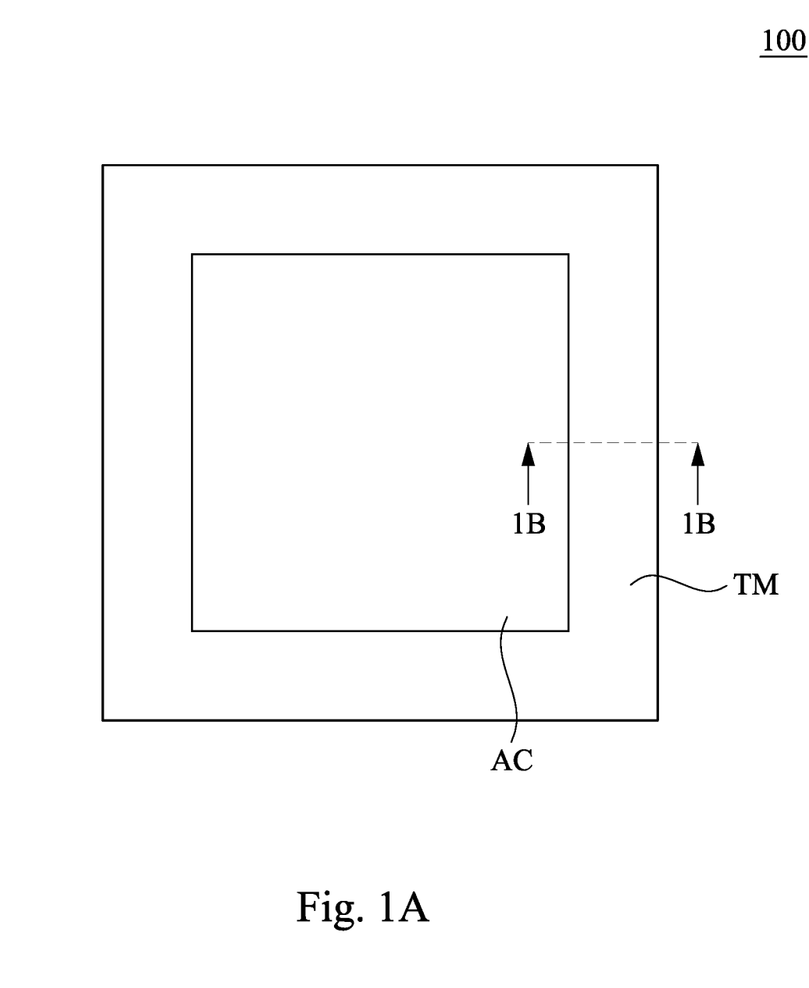
FIG. 1A is a top view of a power semiconductor device according to one embodiment of the present disclosure.
Figure 1B:
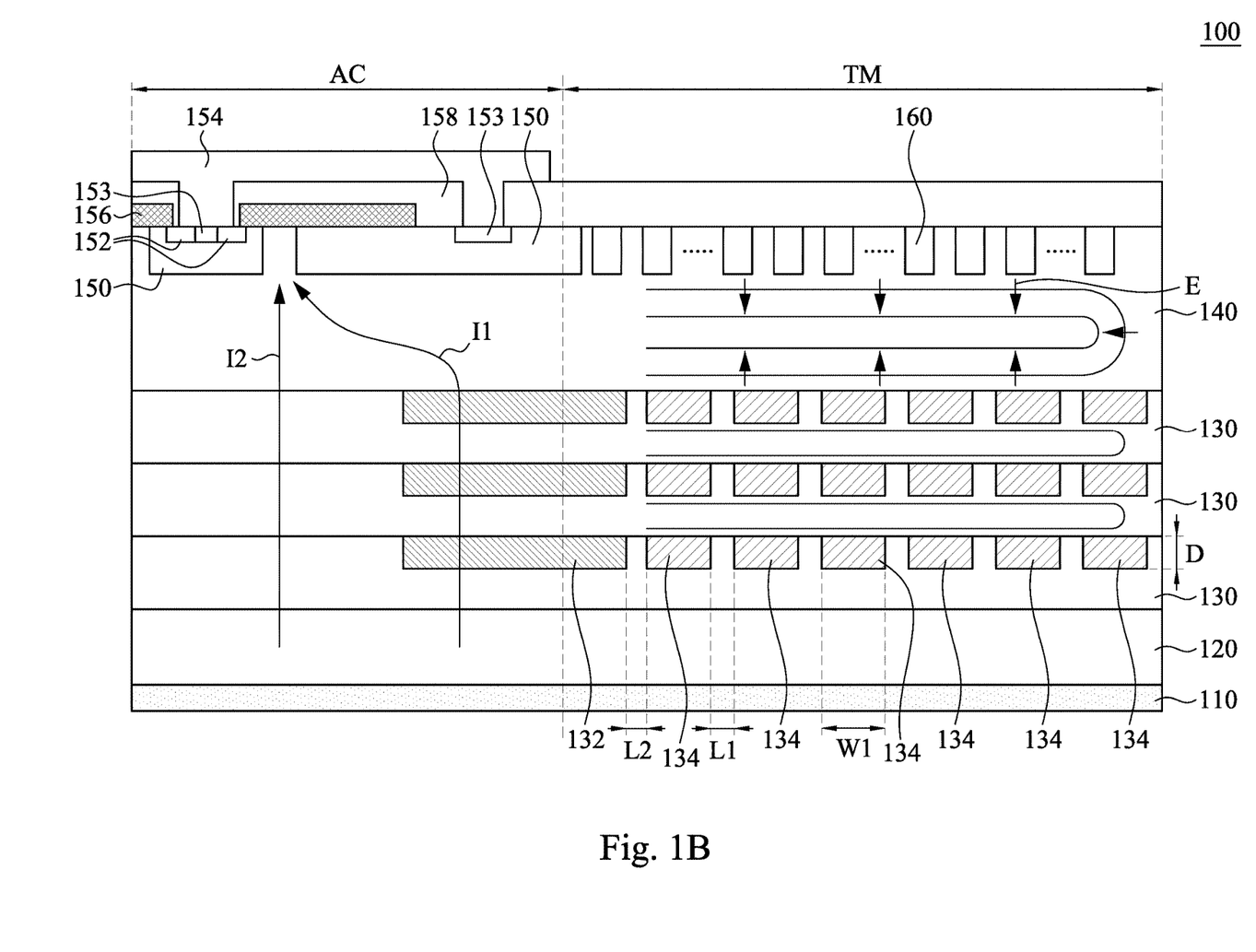
FIG. 1B is a cross-sectional view taken along line 1B-1B in FIG. 1A.

FIG. 1A is a top view of a power semiconductor device 100 according to one embodiment of the present disclosure. FIG. 1B is a cross-sectional view taken along line 1B-1B in FIG. 1A. The power semiconductor device 100 includes a first electrode 110, a substrate 120, a first epitaxy layer 130, a second epitaxy layer 140, a second electrode 154, and a gate electrode 156. The first electrode 110 is a drain electrode, and the second electrode 154 is a source electrode. The substrate 120 includes an active region AC and a termination region TM surrounding the active region AC. The power semiconductor device 100 of the present embodiment is an N type (first conductive type) device. A material of the substrate 120 includes Silicon Carbide (SiC), and the substrate 120 is an N type heavily doped substrate. Silicon Carbide is a wide band-gap material that is suitable for high voltage power device, and 4H—SiC is used as an example in the present embodiment.

The first epitaxy layer 130 is stacked on the substrate 120. The first epitaxy layer 130 may have multiple layers. For example, three layers are demonstrated herein, but the present disclosure is not limited thereof. The second epitaxy layer 140 is located at a side of the first epitaxy layer 130 facing away from the substrate 120. That is, the second epitaxy layer 140 is an upper epitaxy layer. The first epitaxy layer 130 and the second epitaxy layer 140 have the same conductive type (N type) as the conductive type of the substrate 120. The doping concentrations of the first epitaxy layer 130 and the second epitaxy layer 140 are lower than the doping concentration of the substrate 120.

Each of the first epitaxy layers 130 includes a first doped area 132 and multiple second doped areas 134. The first doped area 132 is an N type doped area, and the second doped areas 134 are P type doped area (second conductive type). The first doped area 132 is located in the termination region TM and the active region AC. Specifically, the first doped area 132 is partially located at a side of the active region AC proximal to the termination region TM. The second doped areas 134 are located in the termination region TM. In the present embodiment, doping ranges of the first doped area 132 and the second doped areas 134 of each of the first epitaxy layers 130 are the same, but the present embodiment is not limited thereof.

The power semiconductor device 100 further includes a well 150 in the active region AC, a source region 152, another well 153, and gate oxide layer 158. The well 150 is a P type doped region (P– well), and the source region 152 is an N type doped region located in the well 150. The second electrode 154 is electrically connected with the source region 152. The well 153 is a P type heavily doped region (P+– well) electrically connected with the well 150 and the second electrode 154. The gate electrode 156 is located on the source region 152. The gate oxide layer 158 is located on the second epitaxy layer 140. The gate electrode 156 is located on the gate oxide layer 158. The P type well 150 and the N type source region 152 form a channel region.

The power semiconductor device 100 further includes a third doped area 160 located between the second epitaxy layer 140 and the gate oxide layer 158 and located in the termination region TM. The third doped area 160 is a P type doped area. When a reverse bias voltage is applied on the power semiconductor device 100, the second electrode 154 (source electrode) is grounded and the first electrode 110 (drain electrode) has positive voltage. The third doped area 160 makes the maximum electric field shift into the second epitaxy layer 140. Therefore, electric field in the first epitaxy layers 130, the second epitaxy layer 140, and an edge of the termination region TM are reduced by disposing the P type second doped areas 134 in the first epitaxy layers 130 (N type) in the termination TM.

For example, equipotential line is illustrated in the first epitaxy layers 130 and the second epitaxy layer 140 in FIG. 1B. Arrow E exemplarily demonstrates the electric line that points toward the second epitaxy layer 140 from the second doped area 134 based on the equipotential line. Adjacent first epitaxy layers 130 have similar electric potential and electric field distribution. Accordingly, the electrical stress in the first epitaxy layers 130, the second epitaxy layer 140, and the edge of the termination region TM can be reduced by disposing the second doped areas 134 in the first epitaxy layers 130 and throughout the entire termination region TM.

In a conventional termination region design, reliability is reduced due to higher electrical stress concentrated at the edge of the termination region. The aforementioned termination region TM of the present disclosure can avoid reliability reduction problem caused by high electrical stress at the edge of the termination region TM, and therefore the electric field can be reduced. As such, in the present disclosure, the electric field can be reduced without employing large scale termination region design. With such configuration, the area and the overall volume of the termination region TM of the power semiconductor device 100 can be reduced.

In addition, resistance of the first doped area 132 of the present disclosure is reduced by disposing the first doped area 132 in the active region AC and the termination region TM. As shown in FIG. 1B, a current 11 flows through a longer path across the first doped area 132. The current 11 and the current 12 can reduce the drain to source resistance in on-state (RDSon) of the overall power semiconductor device 100. In the present embodiment, the first doped area 132 and the channel region have a distance therebetween. That is, the first doped area 132 does not extend to the position under the well 150 and the source region 152 so as to avoid early voltage breakdown caused by reduced breakdown voltage herein. In other words, by disposing the first doped area 132 in the active region AC and the termination region TW and disposing the second doped areas 134 in the termination region TM, the electric field in the termination region TM and the drain to source resistance in on-state can be reduced, and the breakdown voltage can be maintained or increased.

A doping concentration of the first doped area 132 is in a range from $5 \times 10^{17}$ cm$^{-3}$ to $1 \times 10^{19}$ cm$^{-3}$. A doping concentration of each of the second doped areas 134 is in a range from $5 \times 10^{16}$ cm$^{-3}$ to $2 \times 10^{18}$ cm$^{-3}$. In some embodiments, the doping concentrations of the first doped areas 132 in different first epitaxy layers 130 are the same or different. In some embodiment, the doping concentrations of the second doped areas 134 in the same first epitaxy layer 130 are the same or are different from each other. The doping concentrations of the second doped areas 134 in different first epitaxy layers 130 are the same or are different from each other. For example, the depths D of the first doped areas 132 and the second doped areas 134 can be adjusted depends on practical requirements. When the depths D of the first doped area 132 and the second doped areas 134 are shallower, the corresponding doping concentrations can be higher. When the depths D of the first doped area 132 and the second doped areas 134 are deeper, the corresponding doping concentration can be lower.

Adjacent two of the second doped areas 134 in the same first epitaxy layer 130 have a distance L1 therebetween, and the distance L1 can be adjusted. The distance L2 between the first doped area 132 and the second doped area 134 can be adjusted as well.

The widths W1 of the second doped areas 134 are the same or are different from each other. In other words, the sizes and the doping concentrations of the first doped areas 132 and the second doped areas 134 can balance mutually as long as the electric field in the first epitaxy layer 130, the second epitaxy layers 140, and the edge of the termination region TM can be reduced.

Figure 2:
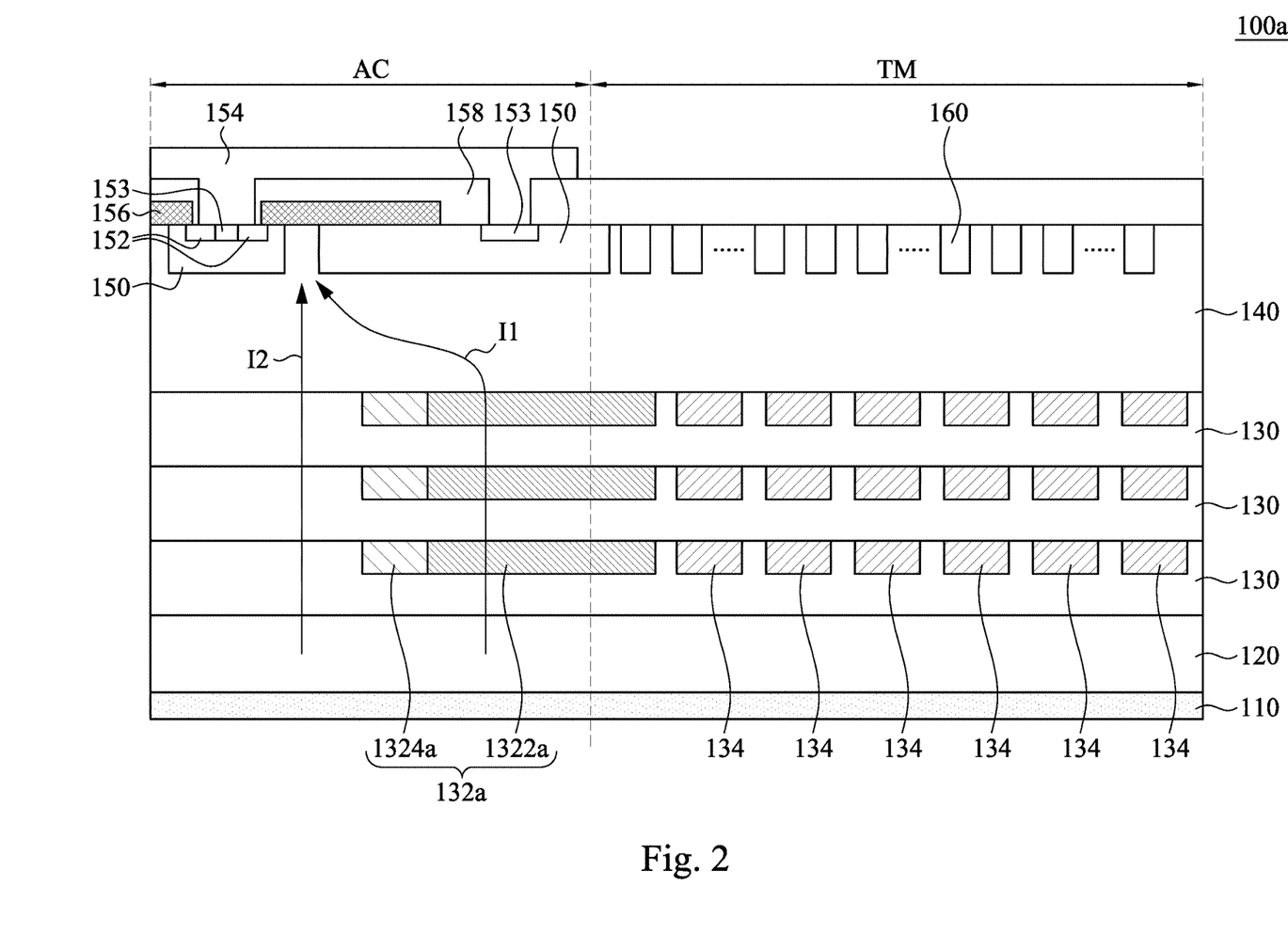
FIG. 2 is a cross-sectional view of a power semiconductor device according to another one embodiment of the present disclosure.

FIG. 2 is a cross-sectional view of a power semiconductor device 100a according to another one embodiment of the present disclosure. The power semiconductor device 100a is similar to the power semiconductor device 100 shown in FIG. 1B, and the difference is that the first doped area 132a of the power semiconductor device 100a includes a first region 1322a and a second region 1324a. The doping concentration of the first region 1322a is greater than the doping concentration of the second region 1324a. In other words, the doping concentration of the second region 1324a that is closer to the channel region is slower. In other embodiments, the second region 1324a can extend to the position under the well 150 and the source region 152 (channel region) as long as the drain to source resistance in on-state can be reduced and the breakdown voltage can be maintained. The power semiconductor device 100a and the power semiconductor device 100 have the same advantages, and the description is not repeated hereinafter.

Figure 3:
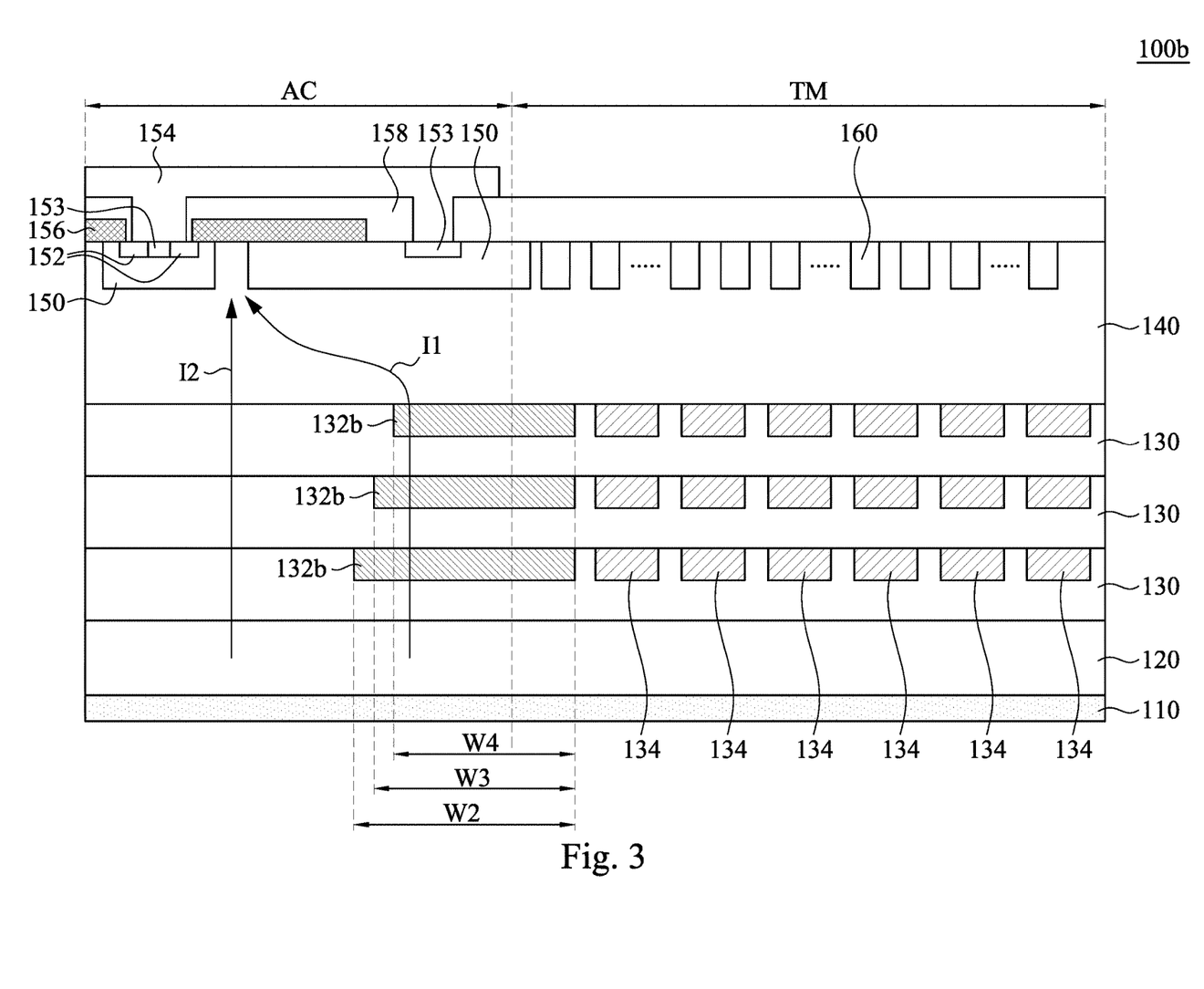
FIG. 3 is a cross-sectional view of a power semiconductor device according to another one embodiment of the present disclosure.

FIG. 3 is a cross-sectional view of a power semiconductor device 100b according to another one embodiment of the present disclosure. The power semiconductor device 100b is similar to the power semiconductor device 100 shown in FIG. 1B, and the difference is that the first doped areas 132b of the power semiconductor device 100b have different widths. The width of the first doped area 132b which is closer to the substrate 120 is wider. That is, the width of the first doped areas 132b increase as the distances between the first epitaxy layers 130 and the second epitaxy layer 140 increase. As shown in FIG. 3, the first doped area 132 at the bottom has a width W2, the first doped area 132 in the middle has a width W3, and the first doped are 132 at the top has a width W4. The width W2 is greater than the width W3, and the width W3 is greater than the width W4. In other embodiment, each of the first doped area 132b may include the first region 1322a and the second region 1324a as shown in FIG. 2, which means that the first doped areas 132b can have different doped concentrations. The power semiconductor device 100b and the power semiconductor device 100 have the same advantages, and the description is not repeated hereinafter.

Figure 4:
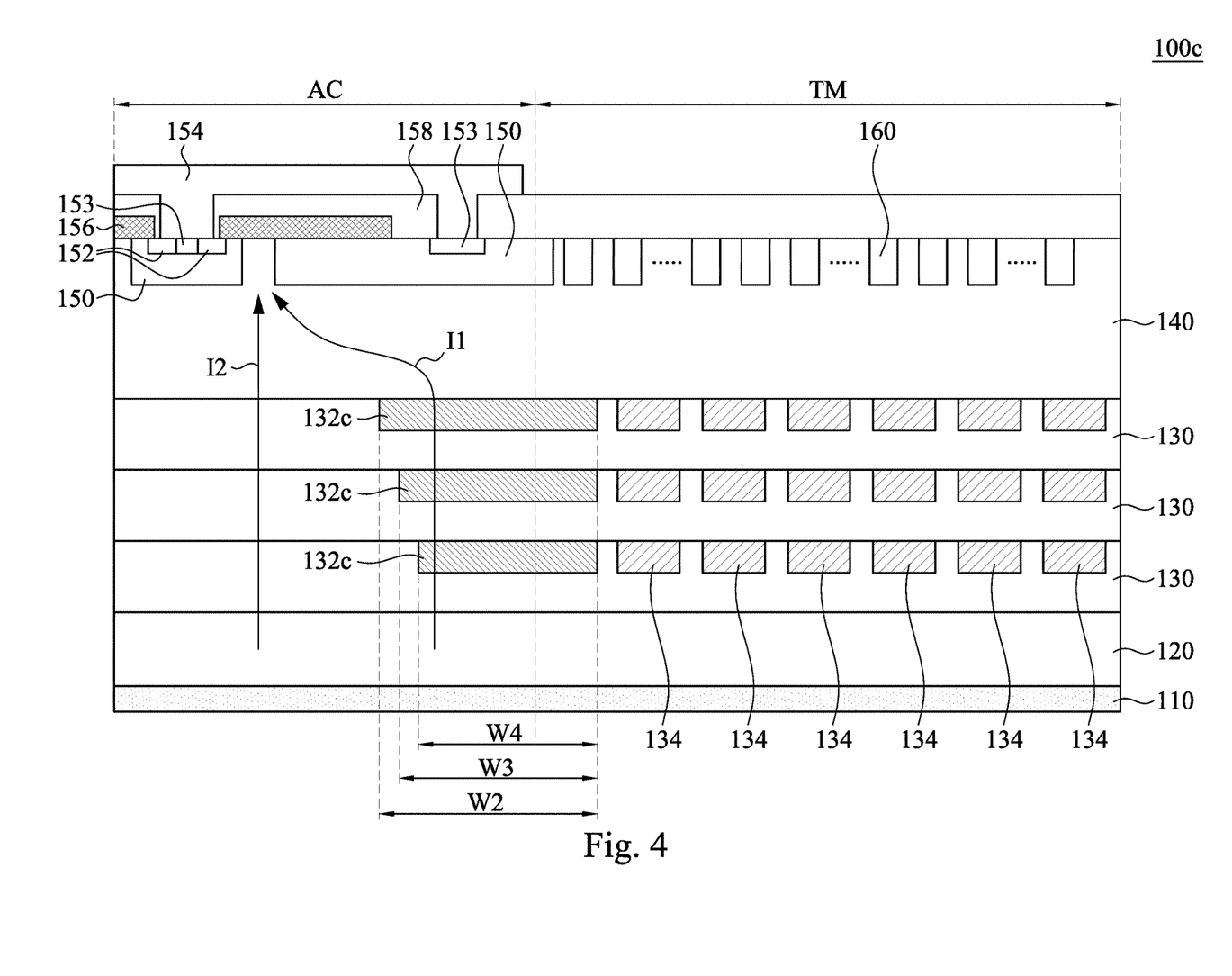
FIG. 4 is a cross-sectional view of a power semiconductor device according to another one embodiment of the present disclosure.

FIG. 4 is a cross-sectional view of a power semiconductor device 100c according to another one embodiment of the present disclosure. The power semiconductor device 100c is similar to the power semiconductor device 100b shown in FIG. 3, and the difference is that the width of the first doped area 132c which is further away from the substrate 120 is wider. That is, the width of the first doped areas 132c reduce as the distances between the first epitaxy layers 130 and the second epitaxy layer 140 increase. As shown in FIG. 4, the width W4 of the first doped area 132c at the bottom is smaller than the width W3 of the first doped area 132c in the middle, and the width W3 is smaller than the width W2 of the first doped area 132c at the top. In other embodiment, the first doped area 132c may include the first region 1322a and the second region 1324a as shown in FIG. 2, which means that the first doped areas 132c can have different doped concentrations. The power semiconductor device 100c and the power semiconductor device 100 have the same advantages, and the description is not repeated hereinafter.

In other embodiment, the widths of the first doped areas 132c in the first epitaxy layer 130 in the middle can be greater than or smaller than the widths of other first doped regions 132c as long as the drain to source resistance in on-state of the power semiconductor device 100c can be reduced.

Figure 5:
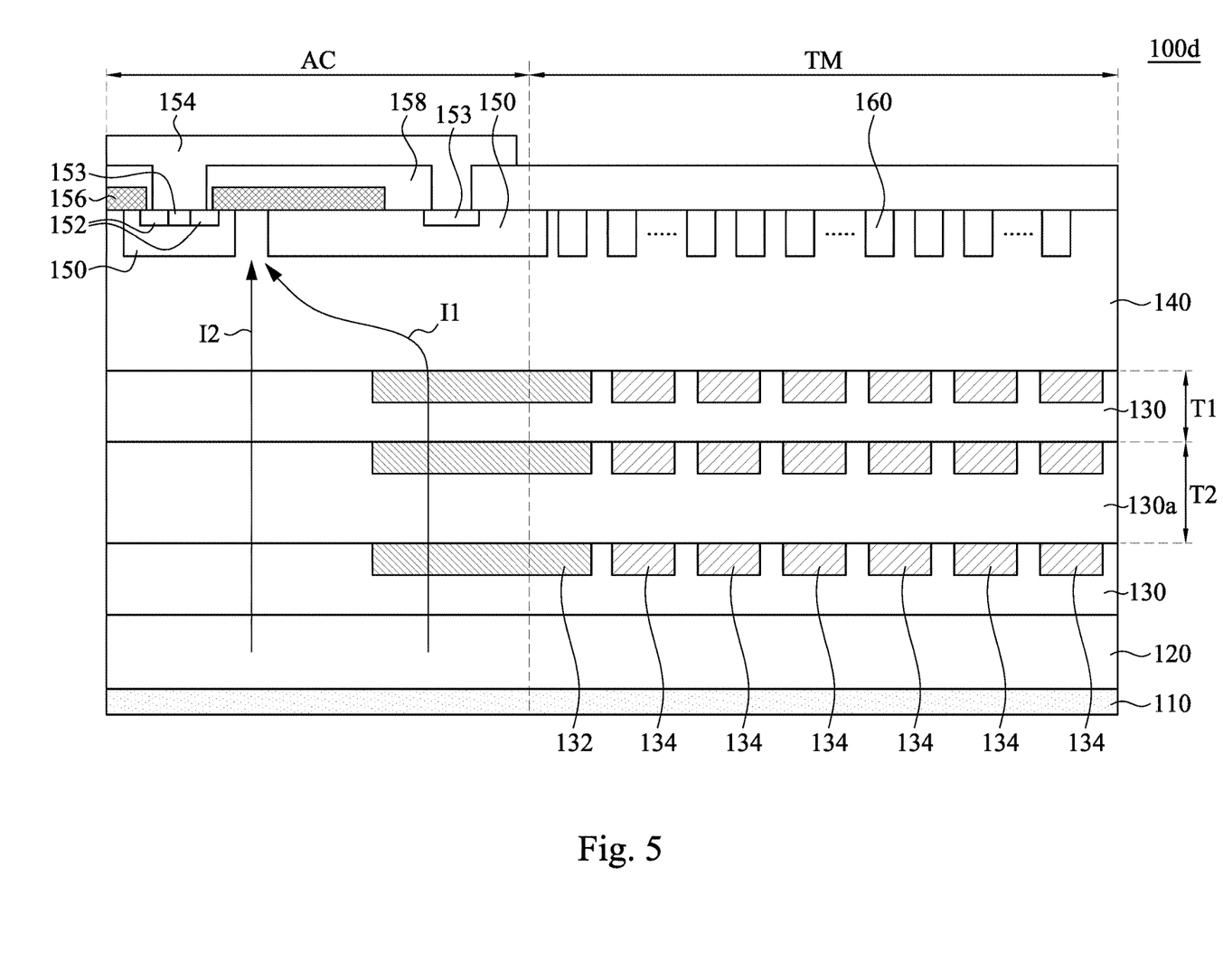
FIG. 5 is a cross-sectional view of a power semiconductor device according to another one embodiment of the present disclosure.

FIG. 5 is a cross-sectional view of a power semiconductor device 100d according to another one embodiment of the present disclosure. In the present embodiment, the thicknesses of the first epitaxy layers 130 are different from each other. For example, the thickness T2 of the first epitaxy layer 130a in the middle is thicker than the thickness T1 of another one of the first epitaxy layer 130. In other embodiment, thicknesses of the first epitaxy layers 130 are different from each other as long as the electric field in the termination region TM can be reduced.

In summary, the electric field in the first epitaxy layer, the second epitaxy layer, and the edge of the termination region can be reduced by disposing a second doped area in the termination region, and therefore the reliability can be improved. The drain to source resistance in on-state of the first doped area of the present disclosure is reduced by disposing the first doped area in the active region and the termination region, and therefore the drain to source resistance in on-state of the overall power semiconductor device is reduced. With such configuration, the area and the overall volume of the termination region of the power semiconductor device can be reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A power semiconductor device, comprising:
a first electrode;
a substrate located on the first electrode, wherein the substrate comprises an active region and a termination region surrounding the active region;
at least one first epitaxy layer located on the substrate, wherein the first epitaxy layer has a first conductive type, and the first epitaxy layer comprises:
a first doped area having the first conductive type and is located in the termination region and the active region; and
a plurality of second doped areas having a second conductive type and are located in the termination region;
a second epitaxy layer located on the first epitaxy layer;
a gate electrode located on the second epitaxy layer and located in the active region; and
a second electrode located on the second epitaxy layer and located in the active region.

2. The power semiconductor device of claim 1, wherein a doping concentration of the first doped area is in a range from $5 \times 10^{17}$ cm$^{-3}$ to $1 \times 10^{19}$ cm$^{-3}$.

3. The power semiconductor device of claim 1, wherein a doping concentration of each of the second doped areas is in a range from $5 \times 10^{16}$ cm$^{-3}$ to $2 \times 10^{18}$ cm$^{-3}$.

4. The power semiconductor device of claim 1, wherein the first doped area further comprises a first region and a second region, the first region is located between the second region and the second doped areas, and a doping concentration of the first region is greater than a doping concentration of the second region.

5. The power semiconductor device of claim 1, wherein a number of the first epitaxy layer is plural, and widths of the first doped areas of the first epitaxy layers increase as the distances between the first epitaxy layers and the second epitaxy layer increase.

6. The power semiconductor device of claim 1, wherein a number of the first epitaxy layer is plural, and widths of the first doped areas of the first epitaxy layers reduce as the distances between the first epitaxy layers and the second epitaxy layer increase.

7. The power semiconductor device of claim 1, wherein a number of the first epitaxy layer is plural, and thicknesses of the first epitaxy layers are different from each other.

8. The power semiconductor device of claim 1, wherein a width of one of the second doped areas is different from a width of another one of the second doped areas.

9. The power semiconductor device of claim 1, wherein a depth of one of the second doped areas is different from a depth of another one of the second doped areas.

10. The power semiconductor device of claim 1, wherein adjacent two of the second doped areas have a distance therebetween, and one of the distances between the second doped areas is different form another one of the distances between the second doped areas.

11. A power semiconductor device, comprising:
a first electrode;
a substrate located on the first electrode, wherein the substrate comprises an active region and a termination region surrounding the active region;
a plurality of first epitaxy layers located on the substrate, wherein the first epitaxy layers have a first conductive type, and each of the first epitaxy layers comprises:
a first doped area having the first conductive type and is located in the termination region and the active region; and
at least one second doped area having a second conductive type and is located in the termination region;
a second epitaxy layer located on the first epitaxy layers;
a gate electrode located on the second epitaxy layer and located in the active region; and
a second electrode located on the second epitaxy layer and located in the active region.

12. The power semiconductor device of claim 11, wherein a doping concentration of the first doped area is in a range from $5 \times 10^{17}$ cm$^{-3}$ to $1 \times 10^{19}$ cm$^{-3}$.

13. The power semiconductor device of claim 11, wherein a doping concentration of the second doped area is in a range from $5 \times 10^{16}$ cm$^{-3}$ to $2 \times 10^{18}$ cm$^{-3}$.

14. The power semiconductor device of claim 11, wherein the first doped area further comprises a first region and a second region, the first region is located between the second region and the second doped areas, and a doping concentration of the first region is greater than a doping concentration of the second region.

15. The power semiconductor device of claim 11, wherein thicknesses of the first epitaxy layers are different from each other.

16. The power semiconductor device of claim 11, wherein a width of the second doped area in one of the first epitaxy layers is different from a width of the second doped area in another one of first epitaxy layers.

17. The power semiconductor device of claim 11, wherein a depth of the second doped area in one of the first epitaxy layers is different from a depth of the second doped area in another one of first epitaxy layers.

18. The power semiconductor device of claim 11, wherein a doping concentration of the first doped area in one of the first epitaxy layers is different from a doping concentration of the first doped area in another one of the first epitaxy layers.

19. The power semiconductor device of claim 11, wherein a doping concentration of the second doped area in one of the first epitaxy layers is different from a doping concentration of the second doped area in another one of the first epitaxy layers.

20. The power semiconductor device of claim 11, wherein a number of the second doped area in each one of the first epitaxy layers is plural, and doping concentrations of the second doped areas in the same first epitaxy layer are different from each other.

\* \* \* \* \*